United States Patent [19]

Zushi et al.

[11] Patent Number: 4,739,444
[45] Date of Patent: Apr. 19, 1988

[54] DEVICE FOR ADJUSTING PRESSURE LOSS OF COOLING AIR FOR AN ASSEMBLY OF CARDS CARRYING ELECTRONIC COMPONENTS

[75] Inventors: Shizuo Zushi, Hadano; Tetsuo Ogata, Machida; Mitsuo Miyamoto; Tsutomu Imai, both of Hadano; Fumiyuki Kobayashi, Sagamihara, all of Japan

[73] Assignees: Hitachi, Ltd.; Hitachi Micro Eng. Ltd., both of Tokyo, Japan

[21] Appl. No.: 835,764

[22] Filed: Mar. 3, 1986

[30] Foreign Application Priority Data

May 22, 1985 [JP] Japan .................. 60-108189

[51] Int. Cl.$^4$ .............................. H05K 7/20
[52] U.S. Cl. .................... 361/383; 361/384
[58] Field of Search ............ 62/417, 418; 174/16 R; 361/383–384

[56] References Cited

U.S. PATENT DOCUMENTS 4,093,021  6/1978  Groom .................. 361/384

FOREIGN PATENT DOCUMENTS 1566306  4/1980  United Kingdom .......... 361/384

Primary Examiner—A. D. Pellinen
Assistant Examiner—Gregory D. Thompson
Attorney, Agent, or Firm—Antonelli, Terry & Wands

[57] ABSTRACT

In a cooling structure for electronic apparatus in which cards consisting of electronic components mounted on circuit boards are arranged in parallel on a motherboard. A pressure adjustment device with holes is arranged in a cooling air flow passage of each card. The area of the holes is selected in relation to the pressure loss characteristics of the related card based upon average air-flow sectional area.

3 Claims, 2 Drawing Sheets

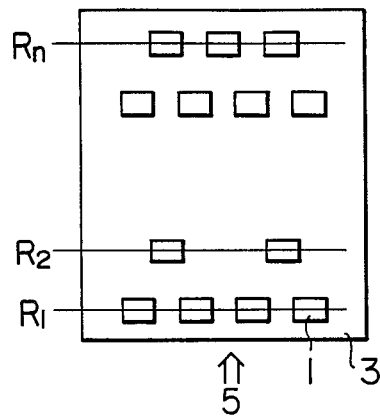
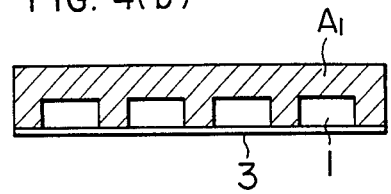
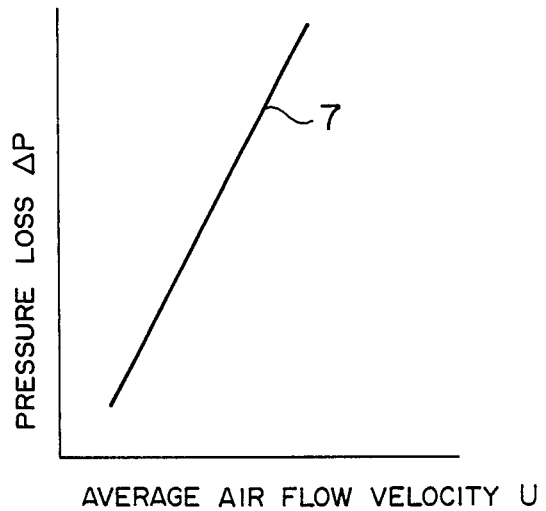
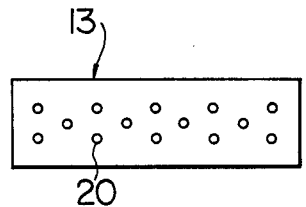

DEVICE FOR ADJUSTING PRESSURE LOSS OF COOLING AIR FOR AN ASSEMBLY OF CARDS CARRYING ELECTRONIC COMPONENTS

BACKGROUND OF THE INVENTION

The present invention relates to a cooling structure which ventilates and cools cards consisting of electronic components on circuit boards by using a fan.

Heat generating electronic components such as integrated circuit chips mounted on a printed circuit board of a card which is mounted on a mother board in parallel with other cards are cooled by sending cooling air from a fan disposed above the group of cards and/or a fan disposed under the group of cards. The cards are different from each other in calorific value. As disclosed in Japanese Patent Unexamined Publication No. 153398/83, for example, therefore, means are provided for adjusting a flow rate of air used for cooling cards having low calorific values, in order to control air flow depending upon the calorific values of the cards. Since cards are different from each other in function and hence in component arrangement, however, the cards have different cooling areas. Further, the flow rate adjustment means on a certain card affects the air flow rates directed to all of other cards. Therefore, it is not easy to distribute cooling air at desired ratios among the respective cards.

SUMMARY OF THE INVENTION

An object of the present invention is to provide a cooling structure capable of supplying adequate cooling air to the respective cards.

In accordance with the present invention, pressure adjustment means is disposed in the air flow passage for each card on the basis of the pressure loss characteristic determined depending upon the average air-flow sectional area of the card.

BRIEF DESCRIPTION OF THE DRAWINGS

FIG. 4A is a plan view of a card having $R_1 \ldots R_n$ rows of electronic components;

FIG. 4B is a view along row $R_1$ of the card of FIG. 4A showing the air-flow sectional area $A_1$ in cross-hatching;

FIG. 4C is a side view of the card of FIG. 4A;

FIG. 5 shows the pressure loss of a card as a function of the average air flow velocity U.

FIG. 6 shows a pressure adjustment device.

DESCRIPTION OF THE PREFERRED EMBODIMENT

The distribution of cooling air among the cards depends upon the pressure loss characteristics in supplying cooling air to the respective cards. Assuming that the packages respectively have pressure loss values $\Delta P_{T1}$ to $\Delta P_{Tn}$ with air flow rates $W_1$ to $W_n$, respectively, the pressure loss $\Delta P_T$ of each cards can be represented by $$\Delta P_{T1} = K_1 W_1^\alpha$$

$$\Delta P_{T2} = K_2 W_2^\alpha$$

$$\vdots$$

$$\Delta P_{Tn} = K_n W_n^\alpha /$$

On the other hand, the cooling air flow rates W applied to the respective cards are determined so as to balance or make equal the pressure loss values $\Delta P_{T1}$ to $\Delta P_{Tn}$ in the respective cards. That is to say, cooling flow rates $W_1$ to $W_n$ distributed to the respective cards are determined so as to satisfy the equation:

$$\Delta P_{T1} = \Delta P_{T2} = \ldots = \Delta P_{Tn}$$

For determining the cooling air flow rates distributed to the respective cards, therefore, it is necessary to know the pressure loss characteristics of the respective cards. We have found that it is possible to estimate the cooling air flow rates distributed to the respective cards by obtaining the pressure loss characteristics of the respective cards based on the average air-flow sectional areas thereof. On the basis of the cooling air flow rates thus determined, pressure adjustment means are disposed in the air flow passages of the cards.

Figure 2:
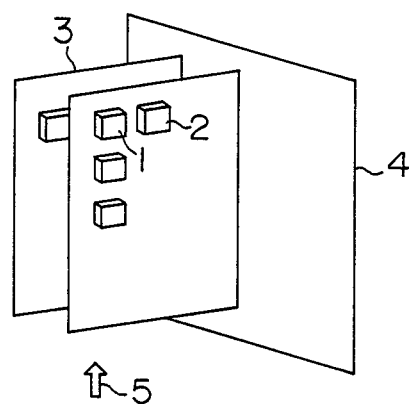
FIG. 2 is a schematic view of cards having electronic components disposed thereon.

FIG. 2 shows a structure in which cards 3 having electronic components 1 and 2, for example, disposed thereon are mounted in parallel on a mother board 4. Respective cards are cooled by a cooling air 5. As described above, the flow rate of the cooling air 5 is defined by the pressure loss characteristics of the card and the efficiency of the fan.

Figure 3:
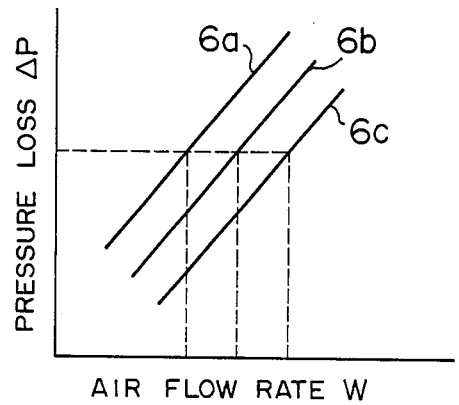
FIG. 3 shows the pressure loss of each card as a function of cooling air flow rate.

FIG. 3 shows a typical relationship between the air flow rate values W and the pressure loss value $\Delta P_T$ of each of the respective cards. As seen from FIG. 3, the respective cards have different pressure characteristics 6a to 6c. As described before, the cooling air is distributed to the respective cards in such a manner that pressure losses $\Delta P_T$ of the cooling air for the respective cards are rendered equal to each other.

For determining the pressure loss characteristic, the concept of average air-flow sectional area is introduced. FIG. 4A is a plan view of the card 3. The electronic components 1 are mounted on the card 3 in rows $R_1$ to $R_n$ along the direction of the air flow 5. FIG. 4B shows an air-flow sectional area A1 of the first row $R_1$. FIG. 4C is a side view of the card of FIG. 4A. and the back edge of an adjacent card. An average air-flow sectional area A is of FIG. 4A and the back edge of an adjacent card obtained by averaging air-flow sectional areas $A_1$, $A_2$, ... $A_n$ measured at the respective rows according to the following equation:

$$A = \frac{A_1 + A_2 + \ldots + A_n}{n}.$$

An average air flow velocity U is depending upon the average air-flow sectional A (m²) and the cooling air flow rate W (m³/hr), applied to the card and represented by $$U = \frac{W_s}{A \cdot 60} \text{ (m/min)}.$$

FIG. 5 shows the pressure loss $\Delta P_T$ as a function of the average air flow velocity U.

As described above, therefore, the cooling air flow rate W is distributed to the respective cards on the basis of the pressure loss characteristic, and hence on the basis of the average air-flow sectional area A.

Figure 1:
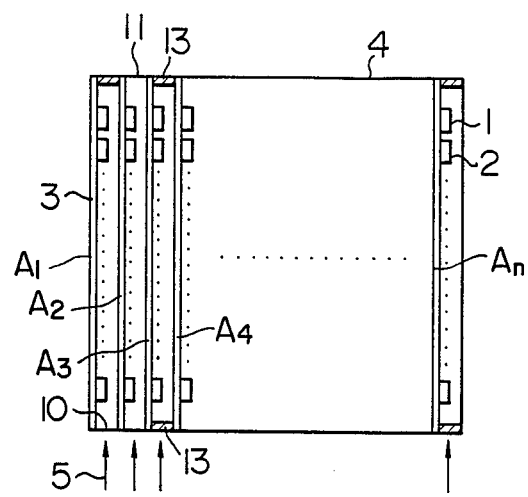
FIG. 1 shows an embodiment of the present invention.

The cards 3 are usually different from each other in the number, type and arrangement of electronic components 1 and 2 mounted thereon. The cooling air 5 is applied to the cards from the lower side by a fan (not shown in the embodiment of FIG. 1). Thus, the cards 3 having different pressure loss characteristics are mounted on the mother board 4. In order to attain a desired cooling air flow rate 5 for each card, a pressure adjustment device 13 shown in FIG. 6 is provided at a cooling air inlet 10 and/or a cooling air outlet 11 of each card for adjusting the pressure loss characteristics of the card. The pressure loss characteristics of each card can be freely adjusted by using the pressure adjustment device. In this embodiment, therefore, the cooling air flow rate 5 of each card can be freely adjusted by adjusting the pressure adjustment device 13 according to the pressure loss characteristics depending upon the average air-flow sectional area of the card.

An example of the pressure adjustment device is shown in FIG. 6 in the form of a plate formed with a number of through holes 20. The cooling air flow rate is adjusted by selecting the ratio of the total area of the holes to the total area of the plate.

In the above described structure according to the present invention, the pressure loss characteristic of each card can be calculated from the average air-flow sectional area of the card. Accordingly, the cooling air flow rate of each card can be estimated by calculation. Since the pressure loss characteristic can be calculated, the cooling air flow rate can be suitably adjusted by adjusting suitable the pressure loss characteristics of each card.

We claim:

1. An assembly of cards carrying rows of electronic components thereon arranged in parallel to each other such that cooling air-flow paths are located between adjacent cards to allow cooling air to flow therethrough and cool the electronic components on each card of the assembly, and pressure adjusting means arranged in at least one of the air-flow paths and having at least one hole therethrough for passage of the cooling air, the ratio of the area of the at least one hole to the total area of the pressure adjusting means being such as to make pressure losses of the cooling air in the air-flow path in which the pressure adjusting means is arranged equal to pressure losses in other air-flow paths when the cooling air is supplied to each air-flow path and the pressure loss of the cooling air in each air-flow path being the average air-flow sectional area of individual air-flow sectional areas measured at each row of electronic components on a respective card, wherein the sectional areas are perpendicular to the direction of the cooling air paths.

2. An assembly according to claim 1, wherein said ratio is selected based on a cooling air-flow rate required for cooling the electronic components of each card, and said average air-flow sectional area is the sum of said individual air-flow sectional areas divided by the total number of said rows.

3. An assembly of cards according to claim 2, wherein the electronic components on each card are arranged in parallel rows perpendicular to the air-flow paths.

* * * * *